United States Patent
Lin

(10) Patent No.: US 10,742,203 B2
(45) Date of Patent: Aug. 11, 2020

(54) DELAY LINE CIRCUIT WITH CALIBRATION FUNCTION AND CALIBRATION METHOD THEREOF

(71) Applicant: Nuvoton Technology Corporation, Hsinchu Science Park (TW)

(72) Inventor: Wei-Ling Lin, Jhubei (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/515,316

(22) Filed: Jul. 18, 2019

(65) Prior Publication Data

US 2020/0177171 A1   Jun. 4, 2020

(30) Foreign Application Priority Data

Dec. 3, 2018 (TW) .............................. 107143198 A

(51) Int. Cl.
*H03K 5/14* (2014.01)
*H03K 5/135* (2006.01)

(52) U.S. Cl.
CPC ............... *H03K 5/14* (2013.01); *H03K 5/135* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,900,762 A * | 5/1999 | Ramakrishnan | ....... | H03K 5/133 327/155 |
| 8,008,956 B1 * | 8/2011 | Shin | ........................ | H03L 7/085 327/148 |
| 8,232,823 B1 * | 7/2012 | Lim | ........................ | G11C 17/16 327/158 |
| 9,941,889 B1 * | 4/2018 | Guo | ........................ | H03L 7/0805 |
| 10,082,823 B1 * | 9/2018 | Chang | ........................ | G11C 7/106 |
| 2005/0068110 A1 * | 3/2005 | Hui | ........................ | H03K 3/0315 331/1 A |
| 2006/0055441 A1 * | 3/2006 | McClannahan | ...... | G11C 7/1066 327/158 |
| 2007/0182423 A1 * | 8/2007 | Lewis | ........................ | H03K 5/14 324/601 |
| 2008/0189568 A1 * | 8/2008 | Kwak | ........................ | G11C 7/1072 713/501 |

(Continued)

*Primary Examiner* — Adam D Houston
(74) *Attorney, Agent, or Firm* — Muncy, Geissler, Olds & Lowe, P.C.

(57) ABSTRACT

A delay line circuit with a calibration function, includes N delay modules and a calibration module. The N delay modules are serially coupled to each other. The calibration module generates a calibration start signal and a calibration stop signal according to a calibration signal and a clock signal, and the calibration start signal is outputted to the N delay modules, so that the N delay modules output N delay signals according to N control signals and the calibration start signal. The calibration module calibrates the N control signals according to the N delay signals and the calibration stop signal, so that the N delay modules generate N calibrated delay signals according to the N calibrated control signals and the clock signal. A generation time instant of the calibration stop signal is later than a generation time instant of the calibration start signal.

15 Claims, 8 Drawing Sheets

(56) References Cited

U.S. PATENT DOCUMENTS

| | | | |
|---|---|---|---|
| 2009/0167384 A1* | 7/2009 | Sohn | G06G 7/16 327/156 |
| 2012/0062290 A1* | 3/2012 | Kenly | H03K 7/08 327/156 |
| 2012/0223755 A1* | 9/2012 | Gomm | H03L 7/0814 327/158 |
| 2014/0028366 A1* | 1/2014 | Chou | H03H 11/26 327/276 |
| 2014/0118038 A1* | 5/2014 | Lin | H03L 7/105 327/149 |
| 2014/0139277 A1* | 5/2014 | Subramanian | H03L 7/0812 327/158 |
| 2014/0152359 A1* | 6/2014 | McLeod | H03L 7/08 327/158 |
| 2014/0312946 A1* | 10/2014 | Mishra | H03K 19/0175 327/158 |
| 2014/0361817 A1* | 12/2014 | Jovenin | H03L 7/08 327/156 |
| 2016/0036485 A1* | 2/2016 | Nagaso | H03L 7/183 455/76 |
| 2018/0054206 A1* | 2/2018 | Im | H03L 7/0812 |
| 2019/0187744 A1* | 6/2019 | Chang | G11C 29/023 |
| 2019/0199361 A1* | 6/2019 | Sudalaiyandi | H03L 7/0814 |
| 2019/0296747 A1* | 9/2019 | Mosalikanti | H03K 5/24 |
| 2020/0036402 A1* | 1/2020 | Kansal | H03L 7/099 |

\* cited by examiner

DELAY LINE CIRCUIT WITH CALIBRATION FUNCTION AND CALIBRATION METHOD THEREOF

CROSS-REFERENCE TO RELATED APPLICATION

This application claims the benefit of Taiwan Patent Application No. 107143198, filed on Dec. 3, 2018, in the Taiwan Intellectual Property Office, the disclosure of which is incorporated herein in its entirety by reference.

BACKGROUND OF THE INVENTION

1. Field of the Invention

The present invention relates to a delay line circuit, and more particularly to a delay line circuit with a calibration function, and a calibration method thereof.

2. Description of the Related Art

A conventional clock filter is provided with a delay line circuit which provides a delay time to determine the frequency filtered by the clock filter. Furthermore, the user can tune the number of delay cells of the delay line circuit by a fixed number, to filter the frequency.

However, when the number of delay cells of the delay line circuit is fixed, in other words, the delay time generated by the delay line circuit is also fixed, and the conventional delay line circuit can meet only one of the process parameters and cannot be applied for other process parameters. As a result, the conventional delay line circuit possibly causes inconvenience in use; for this reason, there is still much room for improvement in the delay line circuit.

SUMMARY OF THE INVENTION

In order to solve the conventional problem, the present invention provides a delay line circuit with a calibration function, and a calibration method thereof, so that a delay time corresponding to the number of the delay cells can be effectively adjusted to meet requirement of different process parameter.

According to an embodiment, the present invention provides a delay line circuit with a calibration function. The delay line circuit includes N delay modules and a calibration module. The N delay modules are serially coupled to each other in a sequential order. The calibration module is configured to generate a calibration start signal and a calibration stop signal according to a calibration signal and a clock signal. The calibration start signal is outputted to the N delay modules, and the N delay modules generate N delay signals according to N control signals and the calibration start signal, and the calibration module calibrates the N control signals according to the N delay signals and the calibration stop signal, and the N delay modules generate the calibrated N delay signals according to the calibrated N control signals and the clock signal. A generation time instant of the calibration stop signal is later than a generation time instant of the calibration start signal.

According to an embodiment, the present invention provides a calibration method for a delay line circuit, and the calibration method includes following steps of: generating a calibration start signal and a calibration stop signal according to a calibration signal and a clock signal; providing the calibration start signal and N control signals to N delay modules, and generating N delay signals by the N delay modules, respectively; calibrating the N control signals according to the N delay signals and the calibration stop signal; and generating, by the N delay modules, the calibrated N delay signals according to the calibrated N control signals and the clock signal; wherein a generation time instant of the calibration stop signal is later than a generation time instant of the calibration start signal.

According to above-mentioned contents, in the delay line circuit with the calibration function, and the calibration method thereof of the present invention, the calibration module can generate the calibration start signal and the calibration stop signal according to the calibration signal and the clock signal, and output the calibration start signal to the N delay modules, and the N delay modules can generate the N delay signals, and the calibration module then calibrate the N control signals according to the N delay signals and the calibration stop signal, so that the N delay modules can generate the calibrated N delay signals according to the calibrated N control signals and the clock signal. The generation time instant of the calibration stop signal is later than the generation time instant of the calibration start signal. As a result, the delay time corresponding to the number of the delay cells can be effectively adjusted to meet requirement for different process parameter, and achieve the power-saving effect.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
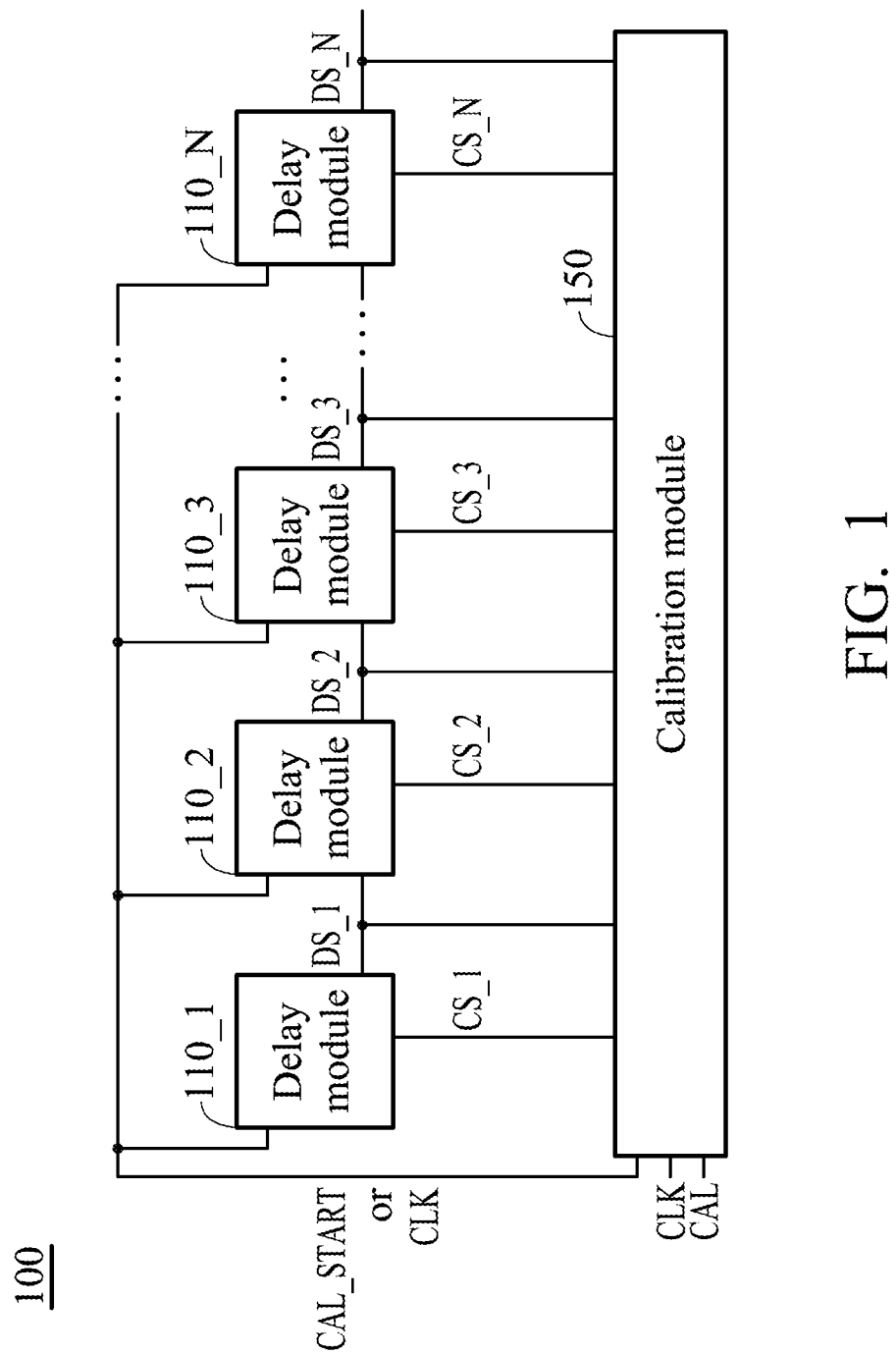
FIG. 1 is a schematic view of a delay line circuit with calibration function, according to an embodiment of the invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be acknowledged to imply the inclusion of stated elements but not the exclusion of any other elements.

FIG. 1 is a schematic view of a delay line circuit with calibration function, according to an embodiment of the invention. Please refer to FIG. 1. The delay line circuit of the embodiment is applicable to a clock filter. The delay line circuit 100 can include N delay modules 110_1~110_N and a calibration module 150, wherein N is a positive integer higher than 1.

The delay modules 110_1~110_N are serially coupled to each other in a sequential order. That is, the delay module 110_1 and the delay module 110_2 are coupled to each other, the delay module 110_2 and the delay module 110_3 are coupled to each other, and so on, the delay module 110_N−1 and the delay module 110_N are coupled to each other.

The calibration module 150 can generate a calibration start signal CAL_START and a calibration stop signal CAL_STOP (not shown in FIG. 1) according to a calibration signal CAL and a clock signal CLK. The calibration module 150 can output the calibration start signal CAL_START and the control signals CS_1~CS_N to the delay modules 110_1~110_N, so that the delay modules 110_1~110_N can generate the delay signals DS_1~DS_N according to the control signals CS_1~CS_N and the calibration start signal CAL_START. The control signal CS_1 is at a high logical level and the control signals CS_2~CS_N are at a low logical level, so that the delay modules 110_1~110_N can generate the delay signals DS_1~DS_N in a sequential order.

Next, the calibration module 150 can receive the N delay signals DS_1~DS_N and calibrate the control signals CS_1~CS_N according to the N delay signals DS_1~DS_N and the calibration stop signal CAL_STOP, so as to adjust the logical levels of the control signals CS_1~CS_N. Next, the calibration module 150 outputs the calibrated control signals CS_1~CS_N to the delay modules 110_1~110_N, so that the delay modules 110_1~110_N can generate the calibrated N delay signals according to the calibrated control signals CS_1~CS_N and the clock signal CLK, thereby meeting the requirement for different process parameter.

In this embodiment, a generation time instant of the calibration stop signal CAL_STOP is later than a generation time instant of the calibration start signal CAL_START. A period between the generation time instant of the calibration stop signal CAL_STOP and the generation time instant of the calibration start signal CAL_START is a half cycle of the clock signal CLK. In other words, the delay line circuit 100 of this embodiment can use the half cycle of the clock signal CLK as a basis of calibration.

Further, the calibration module 150 can detect the generation time instants of the delay signals DS_1~DS_N and the generation time instant of the calibration stop signal CAL_STOP. When the generation time instant of the certain delay signal of the delay signals DS_1~DS_N is later than the generation time instant of the calibration stop signal CAL_STOP and the generation time instant of the certain delay signal is closest to the generation time instant of calibration stop signal CAL_STOP, the calibration module 150 can calibrate the control signals CS_1~CS_N according to the delay signal.

For example, when the calibration module 150 detects that the generation time instant of the delay signal DS_2 is later than the generation time instant of the calibration stop signal CAL_STOP and the generation time instant of the delay signal DS_2 is closest to the generation time instant of calibration stop signal CAL_STOP, the calibration module 150 can calibrate the control signals CS_1~CS_N according to the delay signal DS_2. For example, the calibration module 150 can generate and output the control signals CS_1~CS_N−1 with the low logical level and the control signal CS_N with the high logical level to the delay modules 110_1~110_N, so that the delay line circuit 100 can delay the clock signal CLK through the delay module 110_N only within a normal functioning period, thereby meeting the requirement of the process parameter. Furthermore, the delay modules 110_1~110_N−1 do not operate within the normal functioning period, so as to achieve the power-saving effect.

In other words, when the generation time instant of the delay signal DS_2 of the second delay module 110_2 is later than the generation time instant of the calibration stop signal CAL_STOP and the generation time instant of the delay signal DS_2 is closest to the generation time instant of the calibration stop signal CAL_STOP, it indicates that the delay line circuit 100 just need one delay module, which is the delay module 110_N, to delay the clock signal CLK, so as to meet the requirement of the process parameter.

When the calibration module 150 detects that the generation time instant of the delay signal DS_3 is later than the generation time instant of the calibration stop signal CAL_STOP and the generation time instant of the delay signal DS_3 is closest to the generation time instant of calibration stop signal CAL_STOP, the calibration module 150 can generate and output the control signals CS_1~CS_N−2 and CS_N with the low logical level and the control signal CS_N−1 with the high logical level, to the delay modules 110_1~110_N, according to the delay signal DS_3, so that the delay line circuit 100 can delay the clock signal CLK through the delay modules 110_N−1 and 110_N within the normal functioning period, thereby meeting the requirement of the process parameter. Furthermore, the delay modules 110_1~110_N−2 do not operate within the normal functioning period, so as to achieve the power-saving effect.

In other words, when the generation time instant of the delay signal DS_3 of the third delay module 110_3 is later than the generation time instant of the calibration stop signal CAL_STOP and the generation time instant of the delay signal DS_3 is closest to the generation time instant of calibration stop signal CAL_STOP, it indicates that the delay line circuit 100 need two delay modules, which are the delay modules 110_N−1 and 110_N in this embodiment, to delay the clock signal CLK, thereby meeting the requirement of different process parameter. The manner of generating the remaining delay signals and control signals can be deduced from above-mentioned examples, so detailed descriptions are not repeated herein.

Figure 2:
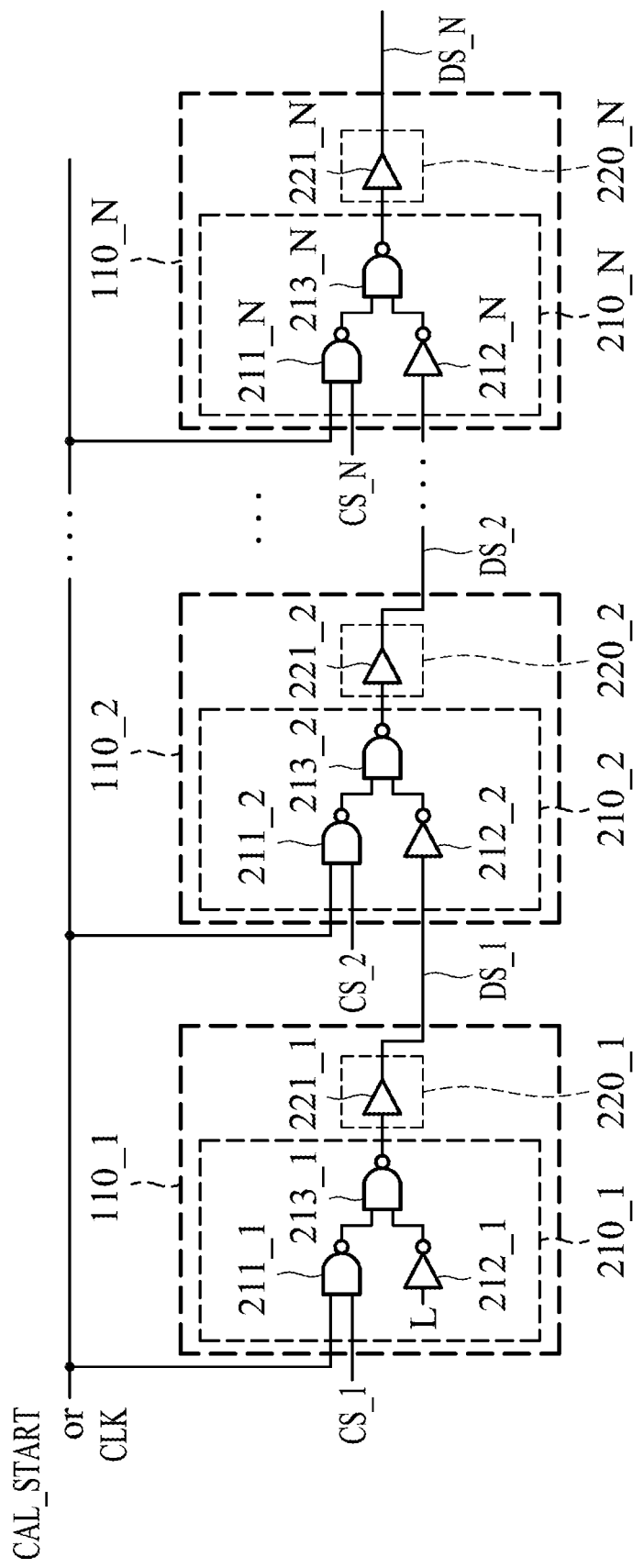
FIG. 2 is a detailed circuit diagram of N delay modules of FIG. 1.

FIG. 2 is a detailed circuit diagram of the N delay modules of FIG. 1. As shown in FIG. 2, the delay modules 110_1~110_N include control units 210_1~210_N and delay cells 220_1~220_N. Each of the control units 210_1~210_N includes a first input terminal, a second input terminal, a third input terminal and an output terminal. The first input terminals of the control units 210_1~210_N receive the calibration start signal CAL_START or the clock signal CLK, the second input terminals of the control units 210_1~210_N receive the control signals CS_1~CS_N, respectively, or receive the calibrated control signal, and the output terminals of the control units 210_1~210_N generates the output signals.

The delay cells 220_1~220_N are coupled to the output terminals of the control units 210_1~210_N, respectively, and configured to receive the output signals generated by the control units 210_1~210_N, respectively, and generate the delay signals DS_1~DS_N, respectively. The third input terminal of the control unit 210_1 of the first delay module 110_1 receives the low logical-level signal, the third input terminal of the control unit of the i-th delay module 110_i is coupled to the output terminal of the delay cell of the (i−1)th delay module 110_i−1, wherein 1<i≤N. In other words, the third input terminal of the control unit 210_2 of the second delay module 110_2 is coupled to the output terminal of the delay cell 220_1 of the first delay module 110_1, the third input terminal of the control unit 210_N of the N-th delay module 110_N is coupled to the output terminal of the delay cell 220_N−1 of the (N−1)th delay module 110_N−1.

Furthermore, the control units 210_1~210_N can include first NAND gates 211_1~211_N, inverters 212_1~212_N and second NAND gates 213_1~213_N, respectively.

Each of the first NAND gates 211_1~211_N can include a first input terminal, a second input terminal and an output terminal. The first input terminals of the first NAND gates 211_1~211_N can serve as the first input terminals of the control units 210_1~210_N and are configured to receive the calibration start signal CAL_START or the clock signal CLK. The second input terminals of the first NAND gates 211_1~211_N can serve as the third input terminals of the control unit 210_1~210_N, respectively.

Each of the inverters 212_1~212_N can include an input terminal and an output terminal. The input terminals of the inverters 212_1~212_N can serve as the second input terminals of the control units 210_1~210_N.

Each of the second NAND gates 213_1~213_N can include a first input terminal, a second input terminal and an output terminal. The first input terminals of the second NAND gates 213_1~213_N are coupled to the output terminals of the first NAND gates 211_1~211_N, respectively. The second input terminals of the second NAND gate 213_1~213_N are coupled to the output terminals of the inverters 212_1~212_N, respectively. The output terminals of the second NAND gates 213_1~213_N can serve as the output terminals of the control units 210_1~210_N, respectively.

Furthermore, the delay cells 220_1~220_N can include buffers 221_1~221_N, respectively. Each of the buffers 221_1~221_N can include an input terminal and an output terminal, and the input terminals of the buffers 221_1~221_N can receive the output signals of the control units 210_1~210_N, respectively, and the output terminals of the buffers 221_1221_N can generate the delay signals DS_1~DS_N, respectively.

Figure 3:
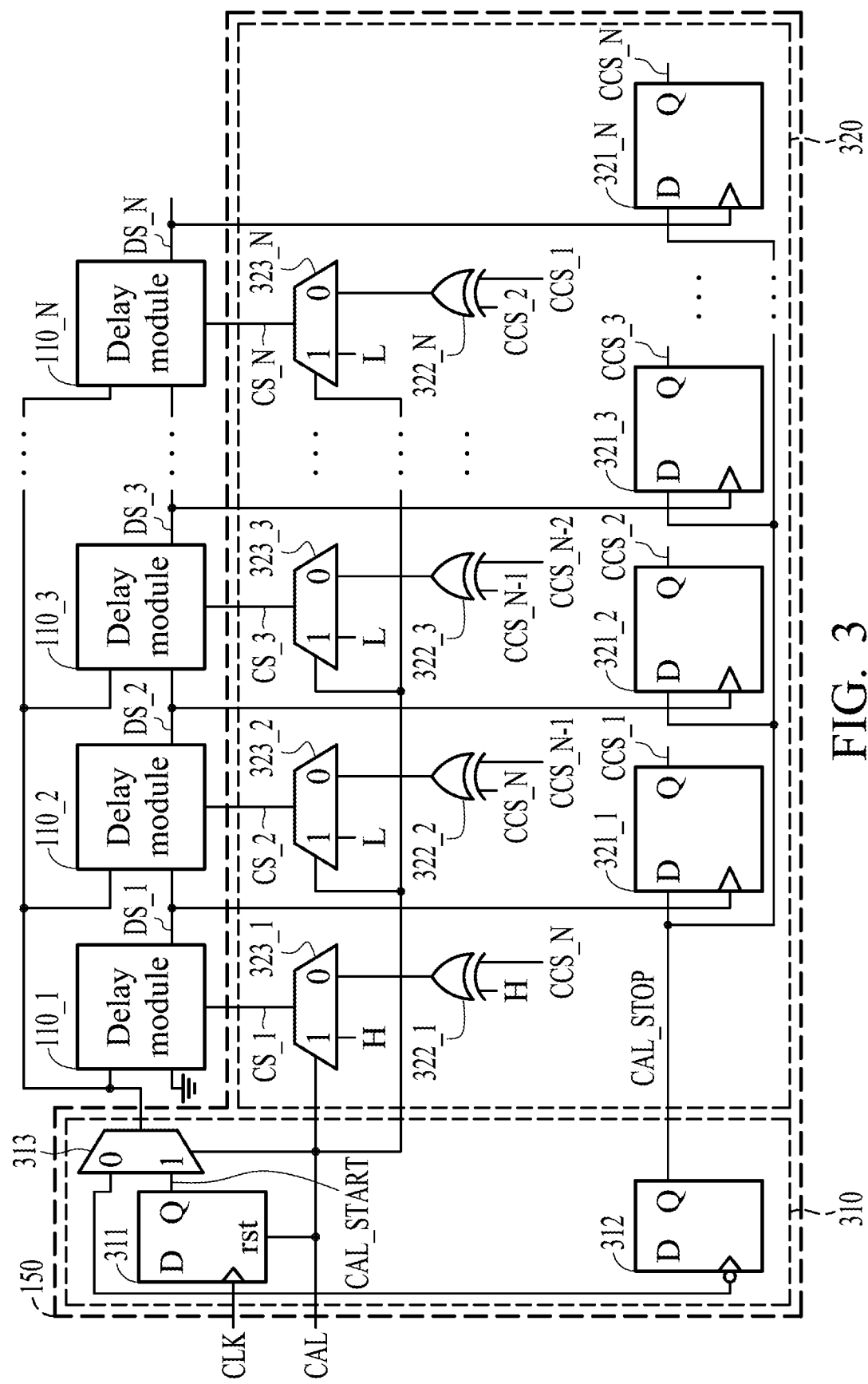
FIG. 3 is a detailed circuit diagram of a calibration module of FIG. 1.

FIG. 3 is a detailed circuit diagram of a calibration module of FIG. 1. As shown in FIG. 3, the calibration module 150 can include a signal generator 310 and a calibration unit 320.

The signal generator 310 is coupled to the delay modules 110_1~110_N, and configured to receive the calibration signal CAL and the clock signal CLK, and generate the calibration start signal CAL_START or the clock signal CLK, and the calibration stop signal CAL_STOP.

The calibration unit 320 is coupled to the signal generator 310 and the delay modules 110_1~110_N, and configured to receive the calibration stop signal CAL_STOP and the delay signals DS_1~DS_N, and generate the control signals CS_1~CS_N.

Furthermore, the signal generator 310 can include a D-Flip-Flop 311, a second D-Flip-Flop 312 and a first selection unit 313.

The first D-Flip-Flop 311 can include a clock input terminal, a reset terminal rst and an output terminal Q. The clock input terminal of the first D-Flip-Flop 311 can receive the clock signal CLK, the reset terminal rst of the first D-Flip-Flop 311 can receive the calibration signal CAL, and the output terminal Q of the first D-Flip-Flop 311 can generate the calibration start signal CAL_START.

The second D-Flip-Flop 312 can include a clock input terminal and an output terminal Q, and the clock input terminal of the second D-Flip-Flop 312 can receive the reverse of the clock signal CLK, and the output terminal Q of the second D-Flip-Flop 312 can generate the calibration stop signal CAL_STOP.

The first selection unit 313 can include a first input terminal, a second input terminal, a control terminal and an output terminal. The first input terminal of the first selection unit 313 is coupled to the output terminal Q of the first D-Flip-Flop 311, the second input terminal of the first selection unit 313 can receive the clock signal CLK, the control terminal of the first selection unit 313 can receive the calibration signal CAL, the output terminal of the first selection unit 313 can output the calibration start signal CAL_START or the clock signal CLK. For example, when the calibration signal CAL is at the high logical level, the output terminal of the first selection unit 313 can output the calibration start signal CAL_START, which is the calibration start signal CAL_START received by the first input terminal of the first selection unit 313. When the calibration signal CAL is at the low logical level, the output terminal of the first selection unit 313 can output the output clock signal CLK, which is the output clock signal CLK received by the second input terminal of the first selection unit 313.

The calibration unit 320 can include N third D-Flip-Flops 321_1~321_N, N first XOR gates 322_1~322_N and N second selection units 323_1~323_N.

Each of the third D-Flip-Flops 321_1~321_N has an input terminal, a clock input terminal and an output terminal Q. The input terminals of the third D-Flip-Flops 321_1~321_N receive the calibration stop signal CAL_STOP. The clock input terminal of the j-th third D-Flip-Flop receives the j-th delay signal, wherein 0<j≤N. The clock input terminal of the first third D-Flip-Flop 321_1 receives the first delay signal DS_1, the clock input terminal of the second third D-Flip-Flop 3212 receives the second delay signal DS_2, the clock input terminal of the third third D-Flip-Flop 321_3 receives the third delay signal DS_3, and so on, and the clock input terminal of the Nth third D-Flip-Flop 321N receives the N-th delay signal DS_N. The output terminals of the third D-Flip-Flops 321_1~321_N generate the calibration control signals CCS_1~CCS_N, respectively.

Each of the first XOR gates 322_1~322_N can include a first input terminal, a second input terminal and an output terminal. The first input terminal of the first first XOR gate 322_1 receives the high logical-level signal H. The first input terminal of the k-th first XOR gate 322_k is coupled to the output terminal of the l-th third flip-flop, wherein k=2~N, and l=N−2. The first input terminal of the second first XOR gate 322_2 is coupled to the output terminal Q of the Nth third D-Flip-Flop 322N and receives the calibration control signal CCS_N, the first input terminal of the third first XOR gate 322_3 is coupled to the output terminal Q of the (N−1)th third D-Flip-Flop 322_N−1 and receives the calibration control signal CCS_N−1, the first input terminal of the Nth first XOR gate 322N is coupled to the output terminal Q of the second third D-Flip-Flop 321_1 and receives the calibration control signal CCS_2.

The two input terminals of the o-th first XOR gate 322_o are coupled to the output terminal of the p-th third D-Flip-Flop 321_p, wherein o=1~N, and p=N−1. In other words, the second input terminal of the first first XOR gate 322_1 is coupled to the output terminal Q of the N-th third D-Flip-Flop 321N and receives the calibration control signal CCS_N, the second input terminal of the second first XOR gate 322_2 is coupled to the output terminal Q of the (N−1)th third D-Flip-Flop 321_N−1 and receives the calibration control signal CCS_N−1, the second input terminal of the third first XOR gate 322_3 is coupled to the output terminal Q of the (N−2)th third D-Flip-Flop 321_N−2 and receives the calibration control signal CCS_N−2, and so on, and the second input terminal of the Nth first XOR gate 322_N is coupled to the output terminal of the first third D-Flip-Flop 321_1 and receives the calibration control signal CCS_1.

The output terminals of the first XOR gates 322_1~322_N generate the calibrated control signals CS_1~CS_N respectively.

Each of the second selection units 323_1~323_N can include a first input terminal, a second input terminal, a control terminal and an output terminal. The first input terminal of the first second selection unit 323_1 receives the high logical-level signal H. The first input terminal of the k-th second selection unit 323_k receives the low logical-level signal L, wherein k=2~N. In other words, the first input terminal of the second to N-th second selection units 323_2~323_N receive the low logical-level signal L.

The second input terminal of the o-th second selection unit 323_o is coupled to the output terminal of the o-th first XOR gate, wherein o=1~N. In other words, the second input terminal of the first second selection unit 323_1 is coupled to the output terminal of the first first XOR gate 322_1 and receives the calibrates control signal CS_1, the second input terminal of the second second selection unit 323_2 is coupled to the output terminal of the second first XOR gate 322_2 and receives the control signal CS_2, the second input terminal of the third second selection unit 323_3 is coupled to the output terminal of the third first XOR gate 322_3 and receives the calibrates control signal CS_3, and so on, and the second input terminal of the Nth second selection unit 323_N is coupled to the output terminal of the Nth first XOR gate 323_N and receives the calibrates control signal CS_N.

The control terminals of the second selection units 323_1~323_N receive the calibration signal CAL. The output terminal of the first second selection unit 323_1 generates the high logical-level signal H or the calibrated control signal CS_1. The output terminal of the k-th second selection unit 323_k generates the low logical-level signal L or the calibrated control signal, wherein k=2~N. In other words, the output terminal of the second second selection unit 323_2 generates the low logical-level signal L or the calibrated control signal CS_2, and the output terminal of the Nth second selection unit 323_N generates the low logical-level signal L or the calibrated control signal CS_2.

Figure 4:
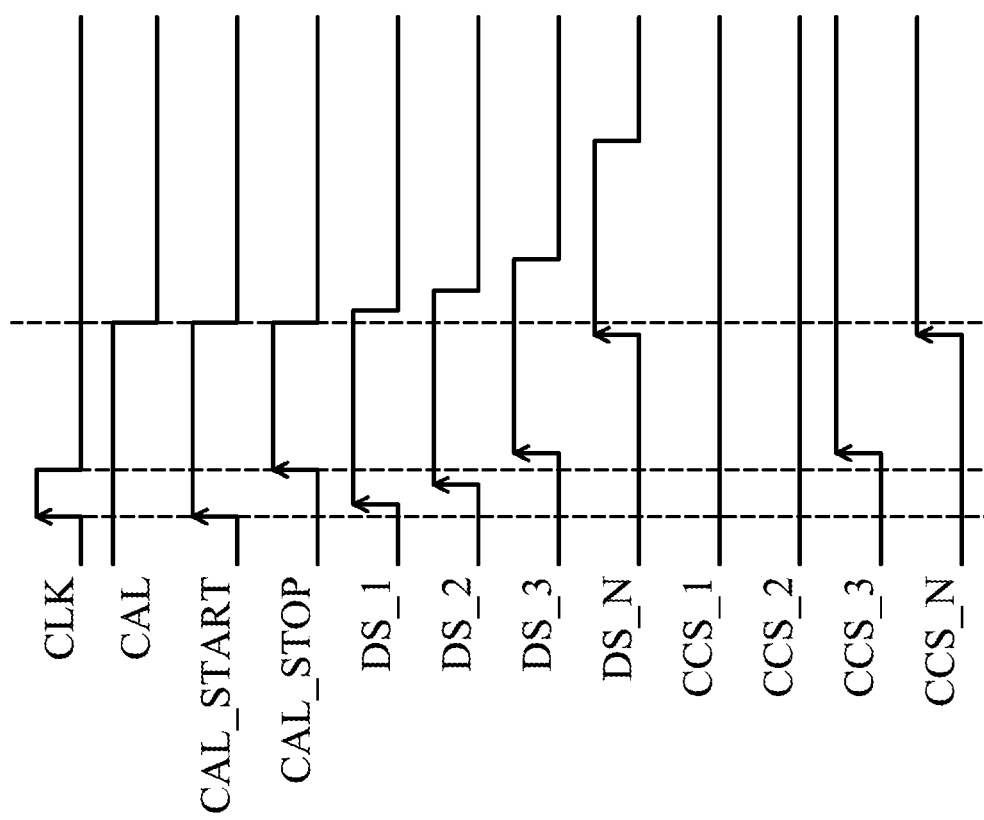
FIG. 4 is a timing diagram of a delay line circuit with a calibration function, according to an embodiment of the invention.

The above-mentioned contents describe the delay line circuit 100 and the internal circuits thereof. The detailed operation of the delay line circuit 100 will be described in following paragraphs with reference to a timing diagram. FIG. 4 is a timing diagram of a delay line circuit with calibration function, according to an embodiment of the invention.

Please refer to FIGS. 1 to 4. Within a calibration period, the calibration signal CAL is at the high logical level. According to the clock signal CLK and the calibration signal CAL, the output terminal Q of the first D-Flip-Flop 311 generates the calibration start signal CAL_START. According to the calibration signal CAL with the high logical level, the first selection unit 313 can select to output the calibration start signal CAL_START generated by the first D-Flip-Flop 311. Furthermore, according to the calibration signal CAL with the high logical level, the second selection unit 323_1~323_N can select to output the high logical-level signal H as the control signal CS_1, and output the low logical-level signals L as the control signals CS_2~CS_N, respectively.

Next, the delay modules 110_1~110_N can generate the delay signals DS_1~DS_N in a sequential order, according to the control signal CS_1 with the high logical level, the control signals CS_2~CS_N with the low logical level, and the calibration start signal CAL_START.

On the other hand, since the second D-Flip-Flop 312 is triggered by a negative edge, the output terminal Q of the second D-Flip-Flop 312 generates the calibration stop signal CAL_STOP according to the reverse of the clock signal CLK. A period between the generation time instant of the calibration stop signal CAL_STOP and the generation time instant of the calibration start signal CAL_START is a half cycle of the clock signal CLK.

Next, the calibration stop signal CAL_STOP is inputted to the input terminals of the third D-Flip-Flops 321_1~321_N. According to the calibration stop signal CAL_STOP and the delay signals DS_1~DS_N, the output terminals Q of the third D-Flip-Flops 321_1~321_N generate the calibration control signals CCS_1~CCS_N, respectively. In this embodiment, the output terminals Q of the third D-Flip-Flops 321_1~321_2 generate the calibration control signals CCS_1~CCS_2 with the low logical level, the output terminals Q of the third D-Flip-Flops 321_3~321_N generate the calibration control signals CCS_3~CCS_N with the high logical level, so it indicates that the generation time instants of the delay signals DS_3~DS_N are later than the generation time instant of the calibration stop signal CAL_STOP.

Next, the calibration control signals CCS_1~CCS_N are inputted to the first input terminals or the second input terminals of the first XOR gates 322_1~322_N, respectively, so that the output terminals of the first XOR gates 322_1~322_N can generate the calibrated control signals CS_1~CS_N, respectively, according to the signals received by the first input terminals and the second input terminals of the first XOR gates 322_1~322_N.

The first input terminal and the second input terminal of the first XOR gate 322_1 receive the high logical-level signal H and the calibration control signal CCS_N with the high logical level, respectively, so that the calibrated control signal CS_1 generated at the output terminal of the first XOR gate 322_1 is at the low logical level. The first input terminals and the second input terminals of the first XOR gates 322_2~322_N-2 can receive the calibration control signals CCS_N~CCS_4 with the high logical level and the CCS_N-1-CCS_3 with the high logical level, respectively, so that the calibrated control signals CS_2~CS_N-2 generated at the output terminals of the first XOR gates 322_2~322_N-2 are at the low logical level. The first input terminal and the second input terminal of the first XOR gate 322_N receives the calibration control signals CCS_2 and CCS_1 with the low logical level, respectively, so that the calibrated control signal CS_N generated at the output terminal of the first XOR gate 322_N is at the low logical level.

Furthermore, the first input terminal of the first XOR gate 322_N-1 receives the calibration control signal CCS_3 with the high logical level, and the second input terminal of the first XOR gate 322_N-1 receives the calibration control signal CCS_2 with the low logical level, so that the calibrated control signal CS_N-1 generated at the output terminal of the first XOR gate 322_N-1 is at the high logical level, it indicates that the generation time instant of the delay signal DS_3 of the third delay module 110_3 is later than the generation time instant of the calibration stop signal CAL_STOP and the generation time instant of the delay signal DS_3 is closest to the generation time instant of calibration stop signal CAL_STOP. In other words, the delay line circuit 100 needs two delay modules to delay the clock signal CLK, thereby meeting the requirement for different process parameter.

After the calibration is completed, the calibration signal CAL is changed from the high logical level to the low logical level, and the delay line circuit enters the normal functioning mode. Next, the (N-1)th second selection unit 323_N-1 can select to output the calibrated control signal CS_N-1 with the high logical level to the delay module 110_N-1, according to the calibration signal CAL with the low logical level, and it indicates that the delay line circuit 100 needs two delay modules to delay the clock signal CLK. Next, the delay line circuit 100 can delay the clock signal CLK through the delay modules 110_N-1 and 110_N, thereby meeting the requirement for different process parameter.

Furthermore, according to the calibration signal CAL with the low logical level, the first to (N-2)th second selection units 323_1~323_N-2 can select to output the calibrated control signal CS_N-1 with the low logical level to the delay modules 110_1~110_N-2, so that the delay modules 110_1~110_N-2 do not operate, thereby achieving the power-saving effect.

Figure 5:
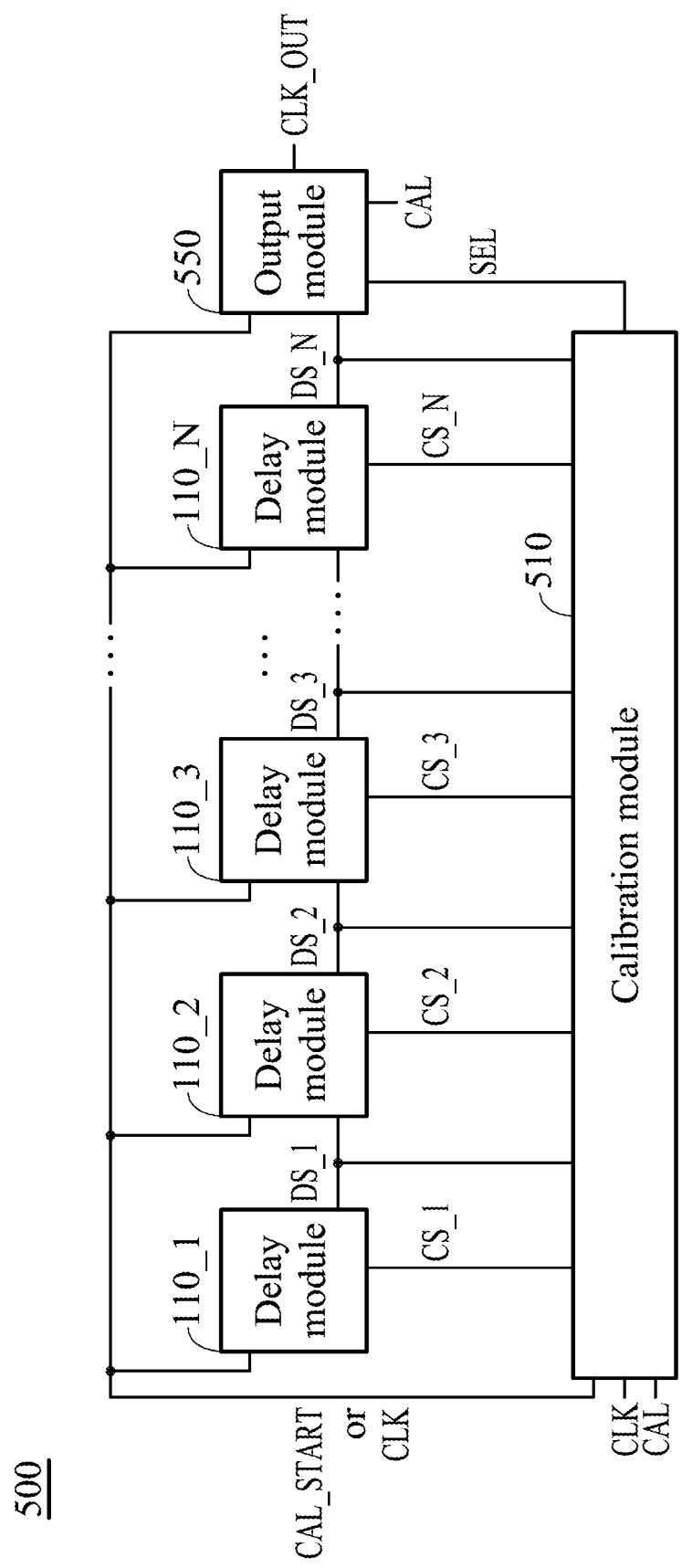
FIG. 5 is a schematic view of a delay line circuit with a calibration function, according to another embodiment of the present invention.

FIG. 5 is a schematic view of a delay line circuit with calibration function of according to another embodiment of the present invention. Please refer to FIG. 5, the delay line circuit 500 of this embodiment can include the N delay modules 110_1~110_N, a calibration module 510 and an output unit 550. The delay modules 110_1~110_N of this embodiment are the same as the delay modules 110_1~110_N of FIG. 1, so the operations of the delay modules 110_1~110_N of this embodiment can refer to illustration of the embodiment of FIG. 1, and detailed descriptions are not repeated herein. Furthermore, the internal circuits of the N delay modules 110_1~110_N and the coupling manner and operation thereof can refer to the illustration of the embodiment of FIG. 2, so detailed descriptions are not repeated herein.

The output unit 550 is coupled to the calibration module 510 and the N-th delay module 110_N and receives the calibration start signal CAL_START or the clock signal CLK, the N-th delay signal DS_N, the calibration signal CAL, and a selection signal SEL generated by the calibration module 510, and the output unit 550 can generate an output clock signal CLK_OUT according to the calibration signal CAL and the selection signal SEL.

Figure 6:
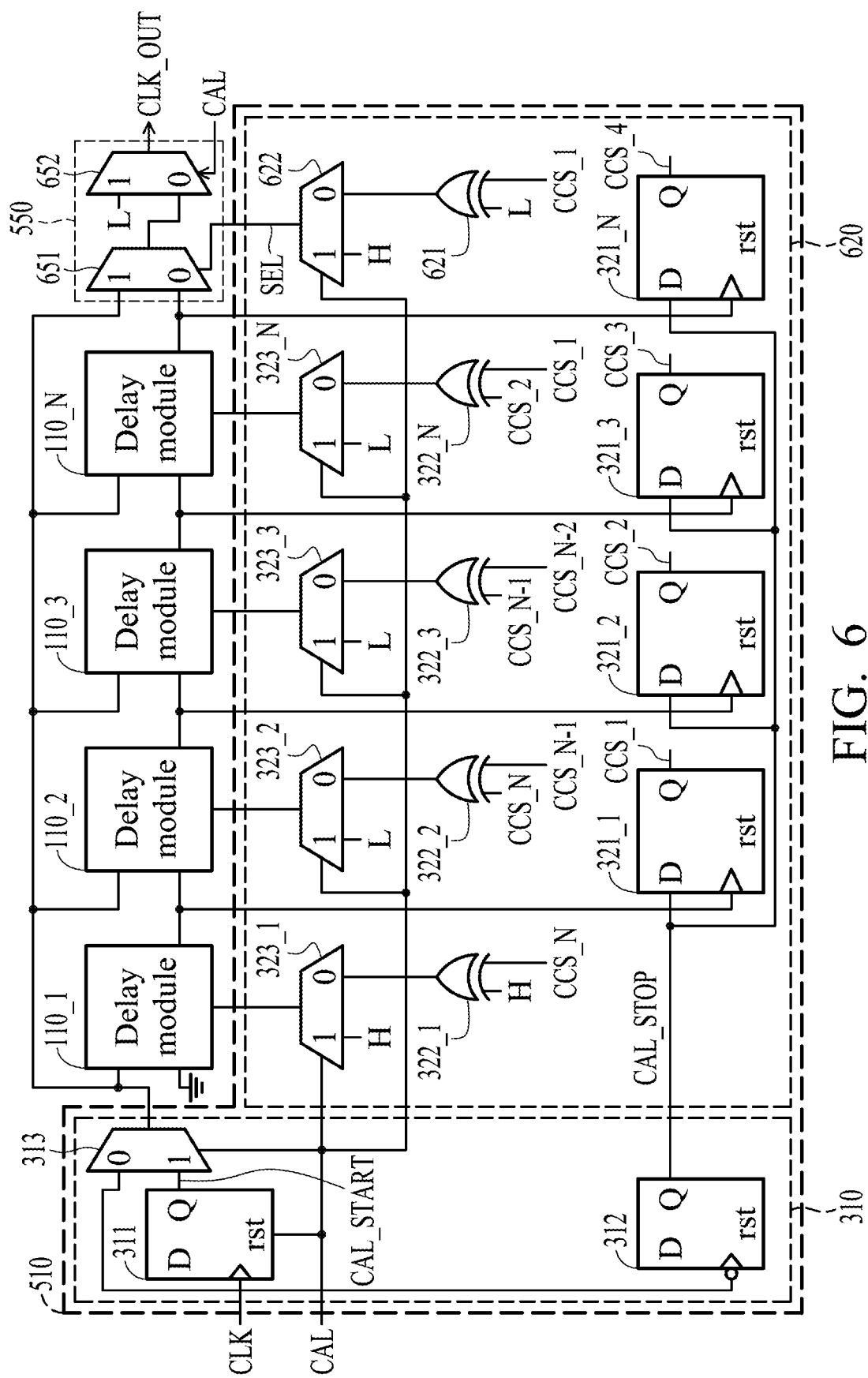
FIG. 6 is a detailed circuit diagram of an output unit and a calibration module of FIG. 5.

FIG. 6 is a detailed circuit diagram of an output unit and a calibration module of FIG. 5. As shown in FIG. 6, the output unit 550 can include a third selection unit 651 and a fourth selection unit 652.

The third selection unit 651 can include a first input terminal, a second input terminal, a control terminal and an output terminal. The first input terminal of the third selection unit 651 receives the calibration start signal CAL_START or the clock signal CLK. The second input terminal of the third selection unit 651 receives the N-th delay signal DS_N. The control terminal of the third selection unit 651 receives the selection signal SEL. The output terminal of the third selection unit 651 outputs the calibration start signal CAL_START, or the clock signal CLK, or N-th delay signal DS_N. In other words, when the selection signal SEL is at the high logical level, the output terminal of the third selection unit 651 outputs the calibration start signal CAL_START or the clock signal CLK; when the selection signal is at the low logical level, the output terminal of the third selection unit 651 outputs the N-th delay signal DS_N.

The fourth selection unit 652 can include a first input terminal, a second input terminal, a control terminal and an output terminal. The first input terminal of the fourth selection unit 652 receives the low logical-level signal L. The second input terminal of the fourth selection unit 652 is coupled to the output terminal of the third selection unit 651. The control terminal of the fourth selection unit 652 receives the calibration signal CAL. The output terminal of the fourth selection unit 652 generates the output clock signal CLK_OUT. In other words, when the calibration signal CAL is at the high logical level, the output terminal of the fourth selection unit 652 outputs the low logical-level signal as the output clock signal CLK_OUT. When the calibration signal CAL is at the low logical level, the output terminal of the fourth selection unit 652 outputs the signal, which is received by the second input terminal of the fourth selection unit 652, as the output clock signal CLK_OUT.

The calibration module 510 can include a signal generator 310 and a calibration unit 620. The signal generator 310 of this embodiment is the same as the signal generator 310 of FIG. 3, so the operation of the signal generator 310 of this embodiment can refer to the illustration for the embodiment of FIG. 3, and detailed description is not repeated herein. Furthermore, the internal devices of the signal generator 310 and the coupling relationship and operations thereof can refer to the illustration for the embodiment of FIG. 3, so detailed descriptions are not repeated herein.

The calibration unit 620 can include the third D-Flip-Flops 321_1~321_N, the first XOR gates 322_1~322_N, the second selection units 323_1~323_N, a second XOR gate 621 and a fifth selection unit 622. The third D-Flip-Flops 321_1321_N, the first XOR gates 322_1322_N and the second selection units 323_1~323_N of FIG. 6 are the same as the third D-Flip-Flops 321_1~321_N, the first XOR gates 322_1322_N and the second selection units 323_1~323_N of FIG. 3, so their operations can refer to the illustration for the embodiment of FIG. 3, and detailed descriptions are not repeated herein.

The second XOR gate 621 can include a first input terminal, a second input terminal and an output terminal. The first input terminal of the second XOR gate 621 receives the low logical-level signal L. The second input terminal of the second XOR gate 621 is coupled to the output terminal Q of the first third D-Flip-Flop 321_1 and receives the first calibration control signal CCS_1.

The fifth selection unit 622 can include a first input terminal, a second input terminal, a control terminal and an output terminal. The first input terminal of the fifth selection unit 622 receives the high logical-level signal H. The second input terminal of the fifth selection unit 622 is coupled to the output terminal of the second XOR gate 621. The control terminal of the fifth selection unit 622 receives the calibration signal CAL, and the output terminal of the fifth selection unit 622 generates the selection signal SEL. In other words, when the calibration signal CAL is at the high logical level, the output terminal of the fifth selection unit 622 generates the high logical-level signal as the selection signal SEL. When the calibration signal is at the low logical level, the output terminal of the fifth selection unit 622 generates the output signal of the output terminal of the second XOR gate 621, as the selection signal SEL.

Figure 7:
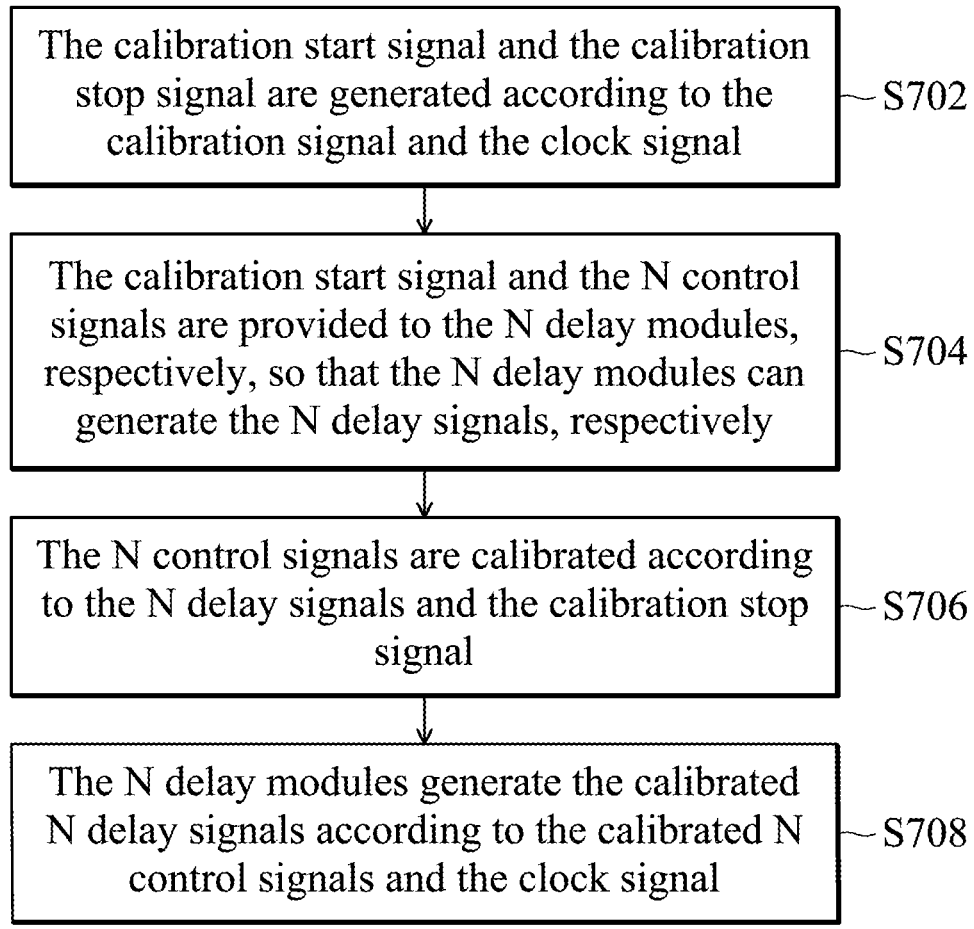
FIG. 7 is a flowchart of a calibration method for a delay line circuit, according to an embodiment of the invention.

According to above-mentioned illustrations for the embodiment, a calibration method for the delay line circuit can be induced. Please refer to FIG. 7, which is a flowchart of a calibration method of a delay line circuit, according to an embodiment of the present invention. The calibration method includes steps S702 to S708.

In a step S702, the calibration start signal and the calibration stop signal are generated according to the calibration signal and the clock signal. In a step S704, the calibration start signal and the N control signals are provided to the N delay modules, respectively, so that the N delay modules can generate the N delay signals, respectively.

In a step S706, the N control signals are calibrated according to the N delay signals and the calibration stop signal. In a step S708, the N delay modules generate the calibrated N delay signals according to the calibrated N control signals and the clock signal. The generation time instant of the calibration stop signal is later than the generation time instant of the calibration start signal. In this embodiment, the period between the generation time instant of the calibration stop signal and the generation time instant of the calibration start signal is a half cycle of the clock signal.

Figure 8:
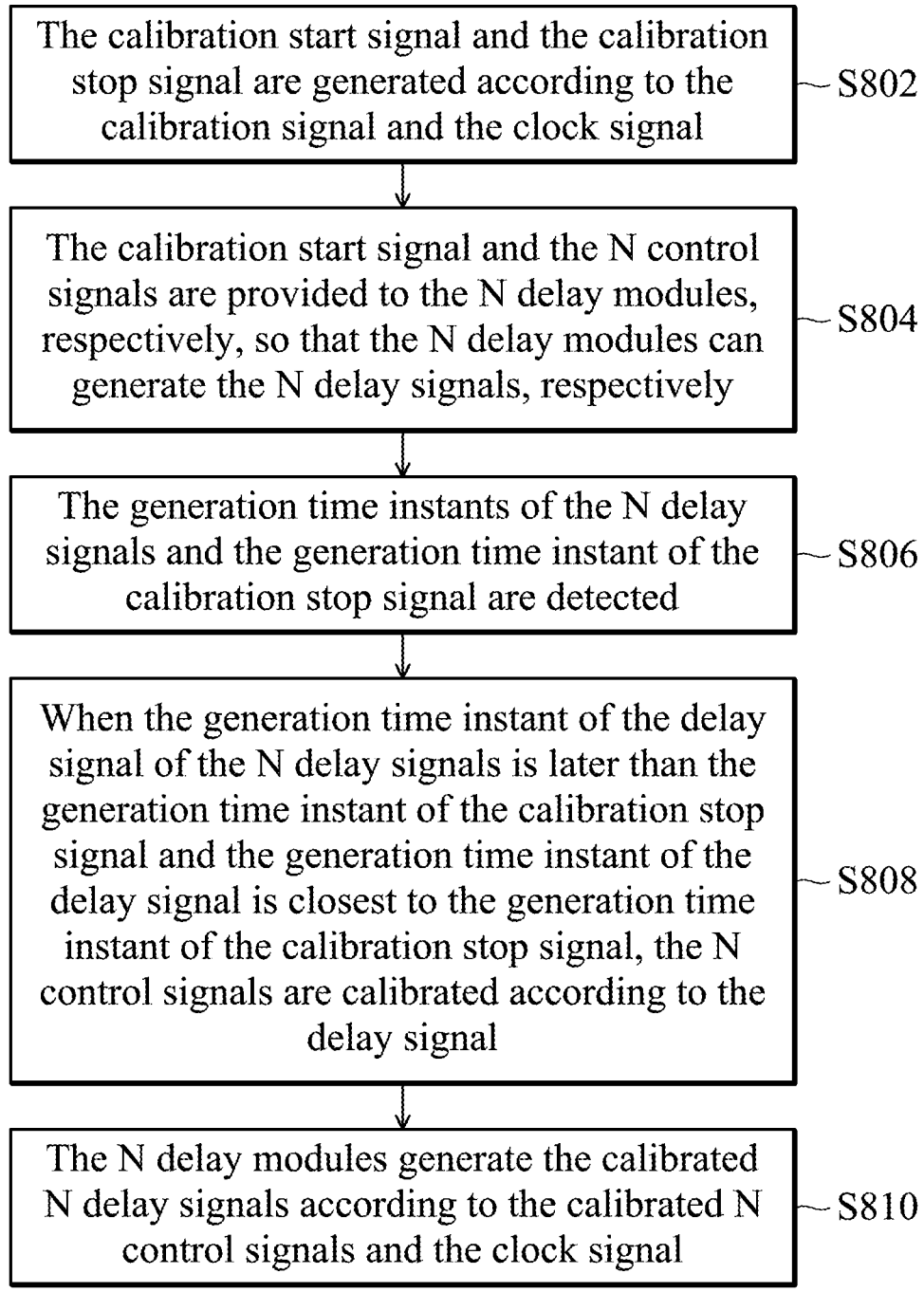
FIG. 8 is a flowchart of a calibration method for a delay line circuit, according to an embodiment of the invention.

FIG. 8 is a flowchart of a calibration method of a delay line circuit according to an embodiment of the invention. In this embodiment, the calibration method includes steps S802 to S810. In a step S802, the calibration start signal and the calibration stop signal are generated according to the calibration signal and the clock signal. In a step S804, the calibration start signal and the N control signals are provided to the N delay modules, respectively, so that the N delay modules can generate the N delay signals, respectively.

In a step S806, the generation time instants of the N delay signals and the generation time instant of the calibration stop signal are detected. In a step S808, when the generation time instant of the delay signal of the N delay signals is later than the generation time instant of the calibration stop signal and the generation time instant of the delay signal is closest to the generation time instant of the calibration stop signal, the N control signals are calibrated according to the delay signal. In a step S810, the N delay modules generate the calibrated N delay signals according to the calibrated N control signals and the clock signal. The generation time instant of the calibration stop signal is later than the generation time instant of the calibration start signal. In this embodiment, the period between the generation time instant of the calibration stop signal and the generation time instant of the calibration start signal is a half cycle of the clock signal.

According to above-mentioned contents, the delay line circuit and the calibration method thereof of the present invention can use the calibration module to generate the calibration start signal and the calibration stop signal according to the calibration signal and the clock signal, and output the calibration start signal to the N delay modules, so that the N delay modules can generate the N delay signals; next, the calibration module can calibrate the N control signals according to the N delay signals and the calibration stop signal, so that the N delay modules can generate the calibrated N delay signals according to the calibrated N control signals and the clock signal. The generation time instant of the calibration stop signal is later than the generation time instant of the calibration start signal. As a result, the delay time corresponding to the number of the delay cells can be adjusted to meet requirement for different process parameter.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A delay line circuit with a calibration function, comprising:
    N delay modules serially coupled to each other in a sequential order; and
    a calibration module configured to generate a calibration start signal and a calibration stop signal according to a calibration signal and a clock signal, wherein the calibration start signal is outputted to the N delay modules, and the N delay modules generate N delay signals according to N control signals and the calibration start signal, and the calibration module calibrates the N control signals according to the N delay signals and the calibration stop signal, and the N delay modules generate the calibrated N delay signals according to the calibrated N control signals and the clock signal;
    wherein a generation time instant of the calibration stop signal is later than a generation time instant of the calibration start signal.

2. The delay line circuit according to claim 1, wherein a period between a generation time instant of the calibration stop signal and a generation time instant of the calibration start signal is a half cycle of the clock signal.

3. The delay line circuit according to claim 1, wherein the calibration module detects generation time instants of the N delay signals and the generation time instant of the calibration stop signal, and when the generation time instant of the delay signal of the N delay signals is later than the generation time instant of the calibration stop signal and the generation time instant of the delay signal is closest to the generation time instant of the calibration stop signal, the calibration module calibrates the N control signals according to the delay signal.

4. The delay line circuit according to claim 1, wherein each of the N delay modules comprises:
  a control unit comprising a first input terminal, a second input terminal, and a third input terminal, and an output terminal, wherein the first input terminal of the control unit is configured to receive the calibration start signal or the clock signal, the second input terminal of the control unit is configured to receive the control signal or the calibrated control signal, and the output terminal of the control unit is configured to generate an output signal; and
  a delay cell coupled to the output terminal of the control unit, and configured to receive the output signal and generate the delay signal;
  wherein the third input terminal of the control unit of the first delay module of the N delay modules receive a low logical-level signal, the third input terminal of the control unit of the i-th delay module of the N delay modules is coupled to the output terminal of the delay cell of the (i−1)th delay module, wherein 1<i≤N.

5. The delay line circuit according to claim 4, wherein the control unit comprises:
  a first NAND gate comprising a first input terminal, a second input terminal and a output terminal, wherein the first input terminal of the first NAND serves as the first input terminal of the control unit to receive the calibration start signal or the clock signal, and the second input terminal of the first NAND gate serves as the third input terminal of the control unit;
  an inverter comprising an input terminal and an output terminal, wherein the input terminal of the inverter serves as the second input terminal of the control unit; and
  a second NAND gate comprising a first input terminal, a second input terminal and an output terminal, wherein the first input terminal of the second NAND gate is coupled to the output terminal of the first NAND gate, the second input terminal of the second NAND gate is coupled to the output terminal of the inverter, and the output terminal of the second NAND gate serves as the output terminal of the control unit.

6. The delay line circuit according to claim 4, wherein the delay cell comprises:
  a buffer comprising an input terminal and an output terminal, wherein the input terminal of the buffer is configured to receive the output signal, and the output terminal of the buffer is configured to generate the delay signal.

7. The delay line circuit according to claim 1, wherein the calibration module comprises:
  a signal generator coupled to the N delay modules, and configured to receive the calibration signal and the clock signal, and generate the calibration start signal or the clock signal, and the calibration stop signal; and
  a calibration unit coupled to the signal generator and the N delay modules, and configured to receive the calibration stop signal and the N delay signals, to generate the calibrated N control signals.

8. The delay line circuit according to claim 7, wherein the signal generator comprises:
  a first D-Flip-Flop comprising a clock input terminal, a reset terminal and an output terminal, wherein the clock input terminal of the first D-Flip-Flop is configured to receive the clock signal, the reset terminal of the first D-Flip-Flop is configured to receive the calibration signal, and the output terminal of the first D-Flip-Flop is configured to generate the calibration start signal;
  a second D-Flip-Flop comprising a clock input terminal configured to receive the reverse of the clock signal, and an output terminal configured to generate the calibration stop signal; and
  a first selection unit comprising a first input terminal coupled to the output terminal of the first D-Flip-Flop, a second input terminal configured to receive the clock signal, a control terminal configured to receive the calibration signal, and an output terminal configured to output the calibration start signal or the clock signal.

9. The delay line circuit according to claim 8, wherein the calibration unit comprises:
  N third D-Flip-Flops, wherein each of the N third D-Flip-Flops comprises an input terminal, a clock input terminal and an output terminal, and the input terminal of each of the N third D-Flip-Flops receives the calibration stop signal, the clock input terminal of the j-th third D-Flip-Flop receives the j-th delay signal, and the output terminals of the N third D-Flip-Flops generates the N calibration control signals, respectively, wherein 0<j≤N;
  N first XOR gates, wherein each of the N first XOR gates comprises a first input terminal, a second input terminal and an output terminal, the first input terminal of the first XOR gate of the N first XOR gates receives a high logical-level signal, the first input terminal of the k-th first XOR gate of the N first XOR gates is coupled to the output terminal of the l-th third D-Flip-Flop of the N third D-Flip-Flops, the second input terminal of the o-th first XOR gate of the N first XOR gates is coupled to the output terminal of the p-th third D-Flip-Flop of the N third D-Flip-Flops, and the output terminals of the N first XOR gates generate the calibrated N control signals, respectively, wherein k=2~N, l=N−2, o=1~N, p=N−1; and
  N second selection units, wherein each of the N second selection units comprises a first input terminal, a second input terminal, a control terminal and an output terminal, the first input terminal of the first second selection unit of the N second selection units receives the high logical-level signal, the first input terminal of the k-th second selection unit of the N second selection units receives the low logical-level signal, the second input terminal of the o-th second selection unit of the N second selection units is coupled to the output terminal of the o-th first XOR gate of the N first XOR gates, the control terminals of the N second selection units receive the calibration signal, the output terminal of the first second selection unit of the N second selection units generates the high logical-level signal or the calibrated control signal, the output terminal of the k-th second selection unit of the N second selection units generates the low logical-level signal or the calibrated control signal.

10. The delay line circuit according to claim 9, further comprising:
  an output unit coupled to the calibration module and the N-th delay cell, and configured to receive the calibration start signal or the clock signal, the N-th delay signal, the calibration signal, and the selection signal generated by the calibration module, and generate an output clock signal according to the calibration signal and the selection signal.

11. The delay line circuit according to claim 10, wherein the output unit comprises:
  a third selection unit comprising a first input terminal, a second input terminal, a control terminal and an output terminal, wherein the first input terminal of the third selection unit receives the calibration start signal or the clock signal, the second input terminal of the third selection unit receives the N-th delay signal, and the control terminal of the third selection unit receives the selection signal; and a fourth selection unit comprising a first input terminal, a second input terminal, a control terminal and an output terminal, wherein the first input terminal of the fourth selection unit receives the low logical-level signal, the second input terminal of the fourth selection unit is coupled to the output terminal of the third selection unit, the control terminal of the fourth selection unit receives the calibration signal, and the output terminal of the fourth selection unit generates the output clock signal.

12. The delay line circuit according to claim 11, wherein the calibration unit comprises:

a second XOR gate comprising a first input terminal, a second input terminal and an output terminal, wherein the first input terminal of the second XOR gate receives the low logical-level signal, and the second input terminal of the second XOR gate is coupled to the output terminal of the first third D-Flip-Flop of the N third D-Flip-Flops and receives the first calibration control signal of the N calibration control signals; and a fifth selection unit comprising a first input terminal, a second input terminal, a control terminal and an output terminal, wherein the first input terminal of the fifth selection unit receives the high logical-level signal, the second input terminal of the fifth selection unit is coupled to the output terminal of the second XOR gate, the control terminal of the fifth selection unit receives the calibration signal, and the output terminal of the fifth selection unit generates the selection signal.

13. A calibration method for a delay line circuit, comprising:

generating a calibration start signal and a calibration stop signal according to a calibration signal and a clock signal;

providing the calibration start signal and N control signals to N delay modules, and generating N delay signals by the N delay modules, respectively;

calibrating the N control signals according to the N delay signals and the calibration stop signal; and generating, by the N delay modules, the calibrated N delay signals according to the calibrated N control signals and the clock signal;

wherein a generation time instant of the calibration stop signal is later than a generation time instant of the calibration start signal.

14. The calibration method according to claim 13, wherein a period between a generation time instant of the calibration stop signal and a generation time instant of the calibration start signal is a half cycle of the clock signal.

15. The calibration method according to claim 13, wherein the step of calibrating the N control signals according to the N delay signals and the calibration stop signal, further comprises:

detecting generation time instants of the N delay signals and the generation time instant of the calibration stop signal; and calibrating the N control signals according to the delay signal when the generation time instant of the delay signal of the N delay signals is later than the generation time instant of the calibration stop signal and the generation time instant of the delay signal is closest to the generation time instant of the calibration stop signal.

* * * * *